(12) United States Patent
Masuda et al.

(10) Patent No.: US 9,122,026 B2
(45) Date of Patent: Sep. 1, 2015

(54) OPTICAL WAVEGUIDE, OPTO-ELECTRIC HYBRID BOARD, AND OPTICAL MODULE

(75) Inventors: Hiroshi Masuda, Ibaraki (JP);
Toshihiro Kuroda, Ibaraki (JP);
Tomoaki Shibata, Ibaraki (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 290 days.

(21) Appl. No.: 13/061,314

(22) PCT Filed: Aug. 28, 2009

(86) PCT No.: PCT/JP2009/065085
§ 371 (c)(1),
(2), (4) Date: Jun. 3, 2011

(87) PCT Pub. No.: WO2010/024394
PCT Pub. Date: Mar. 4, 2010

(65) Prior Publication Data
US 2011/0235964 A1  Sep. 29, 2011

(30) Foreign Application Priority Data
Aug. 29, 2008  (JP) .................................. 2008-221122

(51) Int. Cl.
*G02B 6/12* (2006.01)
*G02B 6/10* (2006.01)
(Continued)

(52) U.S. Cl.
CPC .............. *G02B 6/4214* (2013.01); *G02B 6/138* (2013.01); *H05K 1/0274* (2013.01); *H05K 1/183* (2013.01)

(58) Field of Classification Search
USPC .......................................... 385/62, 88, 91, 92
See application file for complete search history.

(56) References Cited

U.S. PATENT DOCUMENTS 4,201,444 A * 5/1980 McCartney et al. ............. 385/64
5,430,819 A * 7/1995 Sizer et al. ....................... 385/59
(Continued)

FOREIGN PATENT DOCUMENTS

JP        2006-039255       2/2006
JP        2006091241 A *    4/2006
(Continued)

OTHER PUBLICATIONS

Taiwanese Official Action dated May 2, 2014, for TW Application No. 098129114.

*Primary Examiner* — Tina Wong
*Assistant Examiner* — Chris Chu
(74) *Attorney, Agent, or Firm* — Fitch Even Tabin & Flannery

(57) ABSTRACT

The present invention relates to an optical waveguide comprising a lower cladding layer, a patternized core layer and an upper cladding layer, wherein a striking part for positioning is provided in one end part thereof, and an optical path turning mirror face is formed in a position different from a striking part-forming end part in the above core layer.

Capable of being provided are an optical waveguide and an optoelectronic circuit board each having a simple configuration in which an optical device is not mounted on an optical wiring part or an optoelectronic composite wiring part and capable of connecting an optical device with a core of an optical waveguide in an optical wiring part (optical waveguide) or an optoelectronic composite wiring part (optoelectronic circuit board) at a high position accuracy and an optical module comprising an optical waveguide or an optoelectronic circuit board and a connector.

23 Claims, 5 Drawing Sheets

(51) Int. Cl.
  *G02B 6/42*   (2006.01)
  *G02B 6/138*  (2006.01)
  *H05K 1/02*   (2006.01)
  *H05K 1/18*    (2006.01)

(56) References Cited

U.S. PATENT DOCUMENTS

| | | | | |
|---|---|---|---|---|
| 7,780,359 | B2 * | 8/2010 | Kondo et al. | 385/88 |
| 7,934,874 | B2 * | 5/2011 | Honma et al. | 385/97 |
| 8,364,044 | B2 * | 1/2013 | Watanabe et al. | 398/164 |
| 2003/0198454 | A1 * | 10/2003 | Chiang et al. | 385/137 |
| 2004/0126118 | A1 | 7/2004 | Lo et al. | |
| 2004/0151462 | A1 * | 8/2004 | Furuyama | 385/129 |
| 2004/0218888 | A1 * | 11/2004 | Daoud et al. | 385/136 |
| 2005/0238294 | A1 * | 10/2005 | Nagasaka et al. | 385/88 |
| 2006/0001183 | A1 | 1/2006 | Nguyen et al. | |
| 2006/0198569 | A1 * | 9/2006 | Ohtsu et al. | 385/14 |
| 2006/0239605 | A1 | 10/2006 | Palen et al. | |
| 2011/0026892 | A1 * | 2/2011 | Lin et al. | 385/131 |

FOREIGN PATENT DOCUMENTS

| | | |
|---|---|---|
| JP | 2006-267501 | 10/2006 |
| JP | 2006-276892 | 10/2006 |
| JP | 2008-089879 | 4/2008 |

\* cited by examiner

OPTICAL WAVEGUIDE, OPTO-ELECTRIC HYBRID BOARD, AND OPTICAL MODULE

BACKGROUND OF THE INVENTION

The present invention relates to an optical waveguide which can easily be connected with optical devices, an optoelectronic circuit board which can easily connect both of light and electricity and an optical module comprising them and a connector.

Related Art

In high speed and high density signal transmission between electronic devices and between wiring boards, it is observed that transmission through conventional electric wirings is being restricted in a rise in a speed and a density due to barriers brought about by mutual interference and attenuation of signals. In order to break through such restrictions, proposed is a technology of connecting between electronic devices and between wiring boards by means of light, so-called optical interconnection, and various investigations regarding combination of electrical wiring with optical wiring are carried out. In particular, optical wiring is tried to be introduced into hinge parts of portable phones and note type personal computers in recent years, and a flexible optoelectronic composite substrate having a flexibility is used in the above applications.

In respect to combination of electrical wiring and optical wiring, proposed is a structure of a wiring part in which a flexible substrate having electric wirings, an optical device connected to the electric wirings and an optical waveguide connected optically with the optical device and having a flexibility are integrated as described in for example, a patent document 1. The above optical waveguide comprises a core in which light is propagated and a clad surrounding the core, and a 45 degree mirror face for turning an optical path by 90 degrees is formed in a part connected optically with the optical device. The high connecting efficiency has been actualized by loading the optical device after positioned at a high accuracy with the optical waveguide core.

In the above method, however, a structure in which the optical device and the integrated circuits (hereinafter referred to as "IC") are mounted on the wiring part is taken, and therefore there has been involved the problem that attentions have to be paid to handling including breakage, static electricity and the like unlike conventional electric wiring parts to a large extent.

Patent document 1: Japanese Patent Application Laid-Open No. 91241/2006

DISCLOSURE OF THE INVENTION

In light of the problems described above, an object of the present invention is to provide an optical waveguide and an optoelectronic circuit board each having a simple configuration in which an optical device is not mounted on an optical wiring part or an optoelectronic composite wiring part and capable of connecting an optical device with a core of an optical waveguide in an optical wiring part (optical waveguide) or an optoelectronic composite wiring part (optoelectronic circuit board) at a high position accuracy and an optical module comprising an optical waveguide or an optoelectronic circuit board and a connector.

Intensive investigations repeated by the present inventors have resulted in finding that an optical device can easily be positioned with a core of an optical waveguide at a high accuracy based on outlines thereof by devising a form of an optical waveguide part. The present invention has been completed based on the above knowledge.

That is, the present invention provides:

(1) an optical waveguide comprising a lower cladding layer, a patternized core layer and an upper cladding layer, wherein a striking part for positioning is provided at one end part thereof, and an optical path turning mirror face is formed in a position different from a striking part-forming end part of the above core layer, (2) an optoelectronic circuit board, wherein the optical waveguide as described in the above item (1) is integrated with electric wirings and (3) an optical module comprising an optical waveguide and a connector connected with the above optical waveguide, wherein the above optical waveguide comprises a lower cladding layer, a patternized core layer and an upper cladding layer; a striking part for positioning is provided at one end part thereof; an optical path turning mirror face is provided in a position different from a striking part-forming end part of the above core layer; and an inner wall part which is brought into contact with the striking part in connecting the optical waveguide to determine a position of the optical waveguide is provided in the above connector.

According to the present invention, an optical wiring part (optical waveguide) or an optoelectronic composite wiring part (optoelectronic circuit board) in which an optical device is not mounted can be inserted into and detached from a connector, and an optical device in an optical module comprising an optical waveguide and a connector can be connected with a core of the optical waveguide by positioning at a high accuracy.

BRIEF EXPLANATIONS OF THE DRAWINGS

EXPLANATION of CODES

Figure 1:
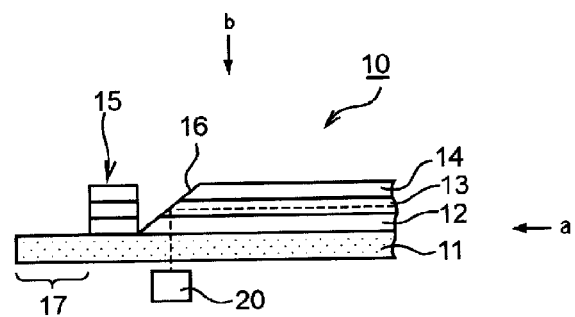
FIG. 1 is a drawing showing the optical waveguide of the present invention.

10: Optical waveguide
11: Base material
12: Lower cladding layer
13: Core layer
14: Upper cladding layer
15: Striking part for positioning
16: Optical path turning mirror face
17: Tip part
20: Optical device
21: IC
30: Connector
31: Cage member
32: Optical waveguide-fixing member
321: Rotation shaft
322: Pressing fixing part
33, 33'; Inner walls
34: Space part
35: Guide for interfitting
36: Guide for determining core center position
40: Electric wiring (optical waveguide)
41: Electric wiring (connector)
42: Connecting part with board
81: Base material film for cladding layer
82: Lower cladding layer
83: Core layer
84: Supporting film for core layer
85: Photomask
86: Core pattern
87: Upper cladding layer
88: Support film for cladding layer

BEST MODE FOR CARRYING OUT THE INVENTION

The optical waveguide of the present invention shall be explained below in detail while referring to the drawings.

The optical waveguide 10 of the present invention shown in FIG. 1 comprises a base material 11, a lower cladding layer 12, a patternized core layer 13 and an upper cladding layer 14, and it is characterized by that a striking part 15 for positioning is provided at one end part thereof and that an optical path turning mirror face 16 is formed in a position different from a striking part-forming end part, to be specific, an inside of the above striking part. The optical path turning mirror face 16 is preferably a 45 degree optical path turning mirror face.

Light used for a communication means is propagated in an inside of the core layer 13 (for example, dotted lines in FIG. 1 and FIG. 3), changed in a direction thereof by the optical path turning mirror face 16 and subjected to optical coupling with an optical device 20 such as a light receiving and emitting device and the like. The optical waveguide of the present invention is positioned at a high accuracy by the striking part 15 for positioning provided at an end part thereof and subjected to optical coupling with the optical device 20.

In this connection, a thickness of the cladding layer (lower cladding layer 12) at a side corresponding to an optical path of the mirror part is desired to be essentially thin as much as possible from the viewpoint of an optical loss, and usually it is preferably 35 μm or less and more preferably 10 to 25 μm considering a film-forming property and an optical loss. Further, it is particularly preferably reduced to 10 μm or less by optimizing the materials and the film-forming method.

The embodiments of the present invention shall be explained below in detail with reference to the drawings. First, in an embodiment (hereinafter referred to as a "first embodiment") shown in FIG. 1 to FIG. 3, a tip part 17 shown in FIG. 1 is provided in an end part of the optical waveguide, and the above tip part 17 is used for interfitting with a connector.

Figure 2:
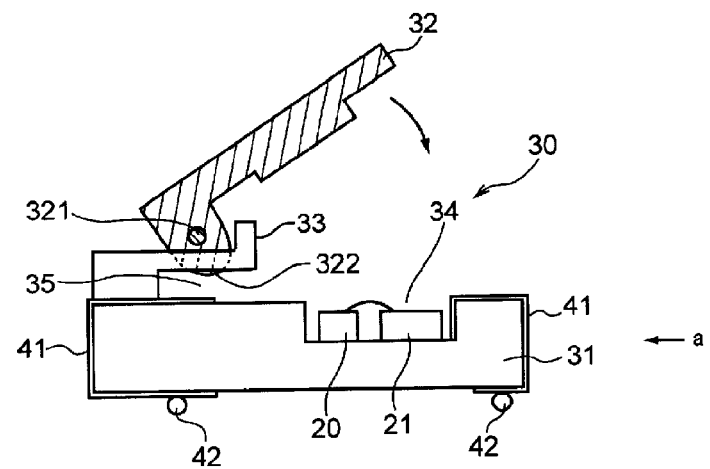
FIG. 2 is a drawing showing the connector in the present invention.

FIG. 2 shows a connector 30 in the first embodiment of the present invention. The connector 30 comprises a cage member 31 and an optical waveguide-fixing member 32, and it is provided with an inner wall 33, a space part 34 and a guide for interfitting 35. An optical device 20 and IC 21 are mounted in the space part 34, and the optical device 20 and the IC 21 are electrically connected each other. The above embodiment prevents the optical device and the IC from conflicting with an optical, wiring or an electrical wiring.

Further, the IC 21 is electrically connected to a connecting part 42 with a board by an electrical wiring 41, and an electric source of the IC 21 is secured.

The guide for interfitting 35 is provided, as described above, in order to interfit it with a tip part 17 of the optical waveguide 10. The tip part 17 is inserted along the guide for interfitting 35 shown in FIG. 2, whereby the optical waveguide 10 is mounted into the connector 30.

The inner wall 33 is brought into contact with the striking part 15 when the optical waveguide 10 is connected to the connector 30, whereby a position of the optical waveguide 10 is determined. That is, when the optical waveguide 10 is pressed into the connector 30, the striking part 15 is struck against the inner wall 33 and stops to determine easily a position of the optical waveguide. Accordingly, positioning of the optical waveguide and the optical device can readily be carried out at a high accuracy only by determining a relative position of the optical device 20 and the inner wall 33 in the connector 30 and a position of the optical path turning mirror face 16 in the optical waveguide 10.

Figure 3:
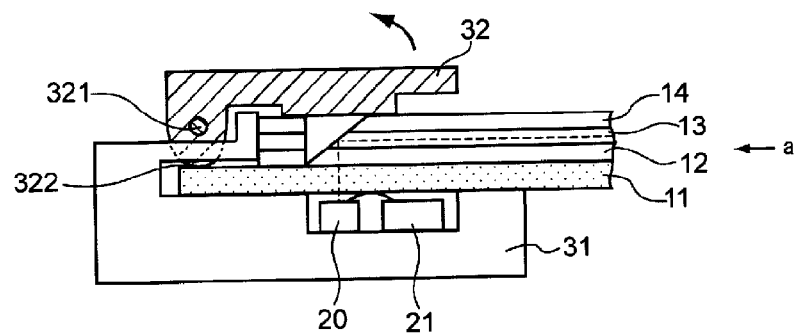
FIG. 3 is a drawing showing the optical module of the present invention.

After a position of the optical waveguide is determined in the manner described above, the optical waveguide-fixing member 32 is pulled down to fix the optical waveguide 10, and in the first embodiment, the tip part 17 is pressed and interfitted by a fixing part 322 (refer to FIG. 3).

The optical waveguide-fixing member 32 is used for fixing the optical waveguide 10, suppressing lifting of the optical waveguide 10 and shortening a distance between a core part 13 (the part of the optical path turning mirror face 16) of the optical waveguide 10 and the optical device 20 to stabilize more optical coupling.

The optical waveguide-fixing member 32 can assume a structure in which it rotates, as shown in FIG. 2 and FIG. 3, around a rotation shaft 321 as a center, and it can assume as well an embodiment in which a pressing fixing part 322 is, as shown in FIG. 3, brought into contact with a base material 11 to fix more firmly the optical waveguide 10. The pressing fixing part 322 is pressed downward and fixed while pulling the tip part 17 by rotation, whereby the striking part 15 can be fixed while pressing it against the inner wall 33 so that a gap is not formed. Accordingly, the optical waveguide 10 is less liable to be pulled out as compared with a case in which it is simply pressed from an upper side. Further, when the base material 11 is a flexible electric wiring board and provided with an electric wiring at the tip part 17, the electric wiring 41 of the connector 30 can be connected well with the electric wiring at the tip part 17 by the pressing fixing part 322.

A form of the optical waveguide-fixing member 32 shall not specifically be restricted as long as it can fix the optical waveguide 10, and it may be, as shown in FIG. 2 and FIG. 3, a rotating form or a form in which the separated optical waveguide-fixing member is pressed from an upper side and connected to the cage member 31 to fix the optical waveguide 10.

The space part 34 described above may be embedded with a resin having a transparency in a wavelength band of an optical signal. The transparency in the above wavelength band is preferably secured because of the reasons that troubles are not brought about on optical communication and that the optical device 20 and the IC 21 can be protected.

Figure 4:
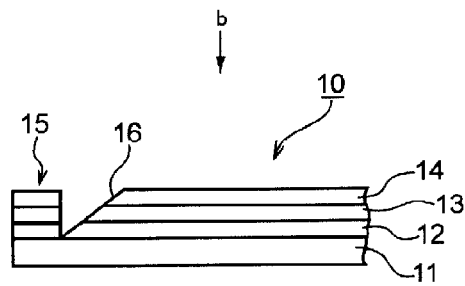
FIG. 4 is a drawing showing another embodiment of the optical waveguide of the present invention.
Figure 5:
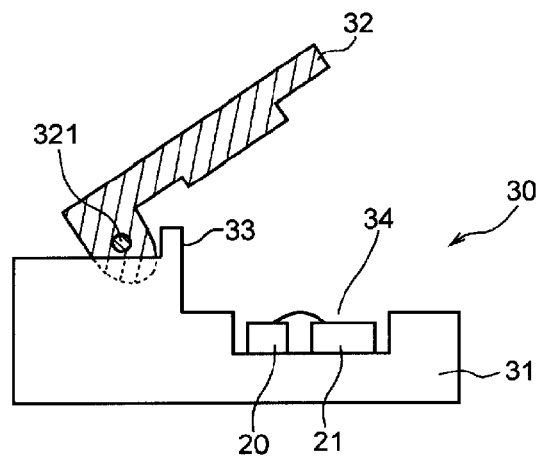
FIG. 5 is a drawing showing another embodiment of the connector in the present invention.
Figure 6:
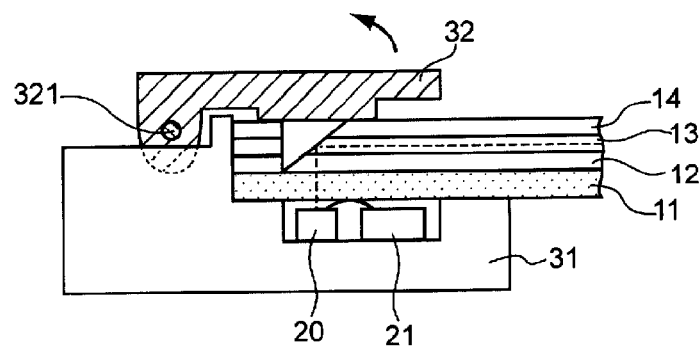
FIG. 6 is a drawing showing another embodiment of the optical module of the present invention.

Next, in an embodiment (hereinafter referred to as a "second embodiment") shown in FIG. 4 to FIG. 6, the tip part 17 is not provided as shown in FIG. 4, and in this case, a connector 30 has a structure in which the guide for interfitting 35 is not provided as shown in FIG. 5. Also in the second embodiment, when a striking part 15 for positioning is brought into contact with an inner wall part 33, a position of an optical waveguide 10 is determined, and an optical waveguide-fixing member 32 is pulled down to fix the optical waveguide 10 (refer to FIG. 6).

Figure 7:
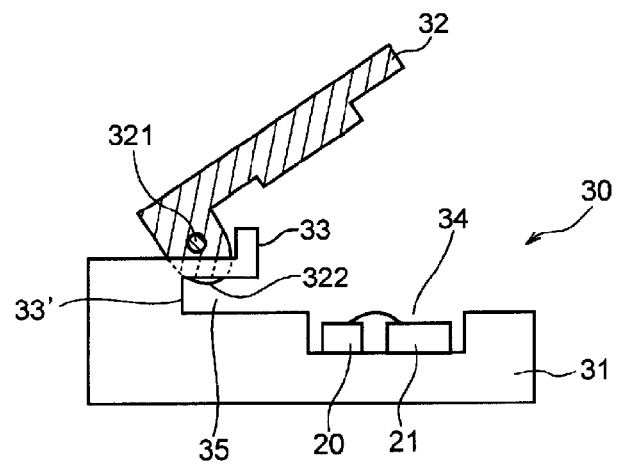
FIG. 7 is a drawing showing another embodiment of the connector in the present invention.
Figure 8:
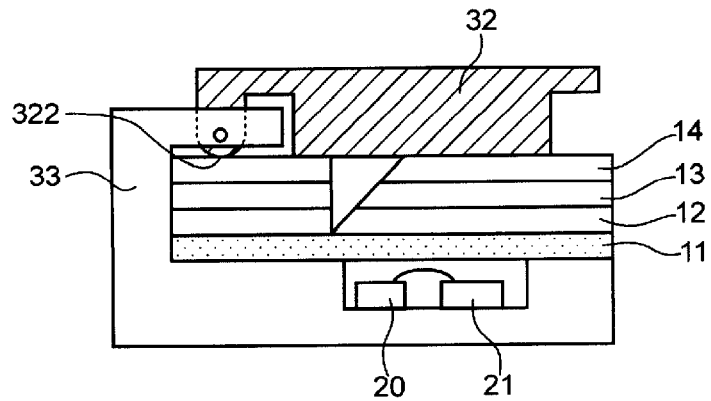
FIG. 8 is a drawing showing another embodiment of the optical module of the present invention.

Further, in an embodiment (hereinafter referred to as a "third embodiment") shown in FIG. 4, FIG. 7 and FIG. 8, a form of an optical waveguide is the same as in the second embodiment, and a connector 30 has a structure shown in FIG. 7. In the connector shown in FIG. 7, when a striking part 15 for positioning in the optical waveguide 10 shown in FIG. 4 is brought into contact with an inner wall part 33' in a guide for interfitting 35, a position of the optical waveguide 10 is determined, and an optical waveguide-fixing member 32 is pulled down to fix the optical waveguide 10. Further, it can assume as well an embodiment in which a pressing fixing part 322 is, as shown in FIG. 8, brought into contact with an upper part of the striking part 15 for positioning to fix more firmly the optical waveguide 10.

Figure 9:
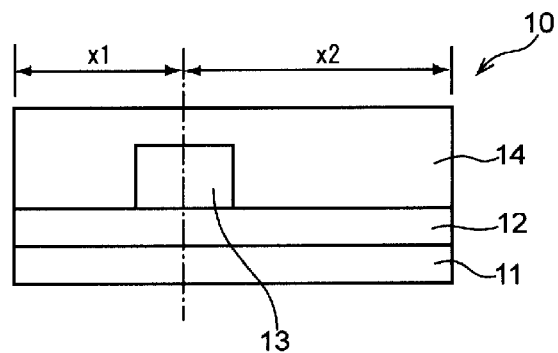
FIG. 9 is a drawing showing a cross-sectional diagram of the optical waveguide of the present invention.

Next, FIG. 9 is one embodiment of a cross-sectional drawing obtained by observing the optical waveguide 10 of the present invention shown in FIG. 1 from a direction of a. In the optical waveguide 10, distances ×1 and ×2 between side end parts and a center of the core are worked out at a good accuracy, and the side end parts are provided preferably with a function of a guide for determining a position of the core in a width direction. In the above embodiment, a position of the core in a width direction can readily be determined by fitting a side end part of the optical waveguide to a specific part of the connector, and the optical waveguide and the optical device can readily be positioned at a high accuracy.

Further, the same shall apply as well in an optoelectronic circuit board in which an optical waveguide and an electric wiring are integrated, and the side end parts of the optoelectronic circuit board are provided preferably with a function of a guide for determining a position of a core in a width direction. Similarly to what is described above, a position of the core in a width direction can readily be determined by fitting a side end part of the optoelectronic circuit board to a specific part of the connector, and the optical waveguide and the optical device can readily be positioned at a high accuracy.

Figure 10:
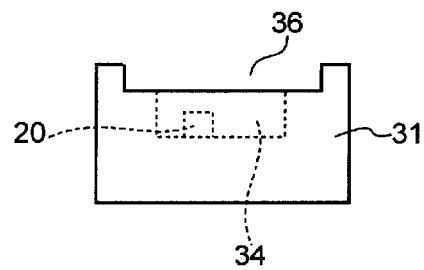
FIG. 10 is a drawing explaining the guide function of the present invention.

Next, FIG. 10 is a cross-sectional drawing obtained by observing the connector 30 shown in FIG. 2 from a direction of a. In this case, however, descriptions of the optical waveguide-fixing member 32 are omitted. A grooved guide 36 which fits to a side end part of the optical waveguide is preferably formed in the connector 30, and the above guide mechanism makes it possible to readily mount the optical waveguide or the optoelectronic circuit board into the connector 30, determine a position of the core and position it with an optical device mounted in the connector 30 at a high accuracy.

Figure 11:
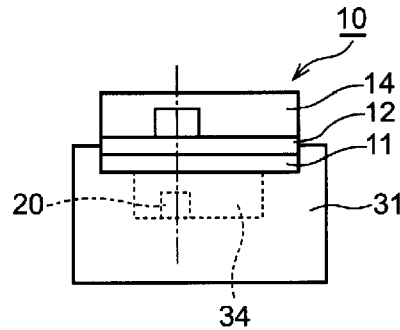
FIG. 11 is a drawing showing a state in which an optical waveguide having a guide function is connected with a connector having a grooved guide.

Further, a state in which an optical waveguide 10 having a guide function is connected with a connector 30 having a grooved guide 36 is shown in FIG. 11. A width of the optical waveguide 10 having a guide function is almost the same size as that of the guide 36 so that it fits to a width of the guide 36 at a connector side, and a width of the optical waveguide 10 is usually designed so that it is slightly smaller than a width of the guide 36. However, when a material of the optical waveguide is a resin, it can be deformed only slightly, and therefore a width of the optical waveguide 10 having a guide function can be increased more than a width of the guide 36 at a connector side. When a width of the optical waveguide 10 is increased more than a width of the guide 36 at a connector side, a slit can be provided at a clad part in order to reduce a stress produced by deformation of the optical waveguide 10.

A position accuracy which is higher toward a width direction is required to a part in which an optical path turning mirror such as a 45 degree mirror is formed, and a side end part of the optical waveguide is preferably provided with a guide mechanism in the vicinity of the above optical path turning mirror.

Further, an embodiment of an optoelectronic circuit board in which an electric wiring is integrated is preferably assumed in the optical waveguide described above. It is because of the reasons that signals can readily be transmitted in a long distance at a high speed and that the optical module can be decreased in a size.

The optoelectronic circuit board obtained by integrating an optical waveguide and an electric wiring comprises preferably an optical waveguide having a flexibility and an electric wiring board having a flexibility. The optical waveguide and the electric wiring board each may be prepared separately and stuck with an adhesive having a high transparency in a wavelength band of an optical signal, or the electric wiring board is prepared in advance, and the optical waveguide may be formed on a back face of the above board by a build-up method. The adhesive shall not specifically be restricted as long as it has a transparency in a wavelength band of an optical signal, and a sheet-like adhesive is preferred from the viewpoint that handling is easy.

Figure 12:
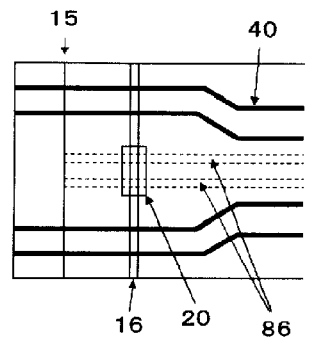
FIG. 12 is a drawing showing one embodiment of electric wirings in the optical waveguide of the present invention.

An optical wiring and an electrical wiring in the optoelectronic circuit board described above shall not specifically be restricted as long as they are wired so that they do not interrupt each other. FIG. 12 is a perspective drawing obtained by observing the optical waveguide 10 of the present invention in FIG. 1 from a direction of b. An example shown in FIG. 12 is a case in which four electrical wirings 40 are provided, and they are arranged so that they avoid a part of an optical device 20. The optical path turning mirror face 16 is arranged on a vertical upper face of the optical device 20. That is, in an embodiment shown in FIG. 12, a tip part of the electrical wiring in the optoelectronic circuit board is present closer to a striking part side (left side in FIG. 12) of the optical waveguide than the optical path turning mirror face 16, and the above electrical wiring is wired so that it does not interfere with the optical path. In other words, the electrical wiring of the optoelectronic circuit board is wired up to a tip part 17 of the optical waveguide 10 in FIG. 12, and the above electrical wiring is wired so that it does not interfere with the optical path.

Figure 13:
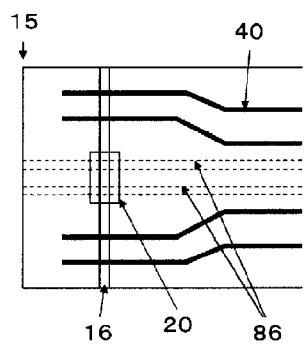
FIG. 13 is a drawing showing another embodiment of electric wirings in the optical waveguide of the present invention.
Figure 14:
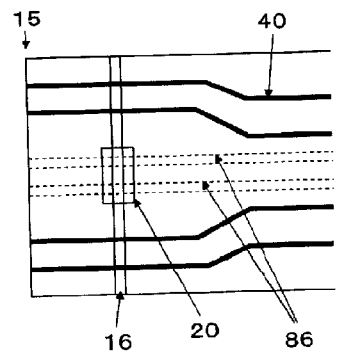
FIG. 14 is a drawing showing another embodiment of electric wirings in the optical waveguide of the present invention.
Figure 15:
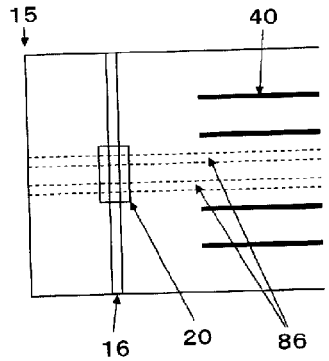
FIG. 15 is a drawing showing another embodiment of electric wirings in the optical waveguide of the present invention.

Further, FIG. 13 to FIG. 15 are perspective drawings obtained by observing the optical waveguide 10 of the present invention in FIG. 4 from a direction of b. In embodiments shown in FIGS. 13 and 14, a tip part of electrical wirings in the optoelectronic circuit board is present closer to a striking part side (left side in FIG. 13 and FIG. 14) of the optical waveguide than the optical path turning mirror face 16, and the above electrical wirings are wired so that they do not interfere with the optical path. The embodiment shown in FIG. 13 is a case in which the tip part of the electrical wirings in the optoelectronic circuit board is present between the striking part 15 for positioning and the optical path turning mirror face 16, and in the embodiment shown in FIG. 14, the wirings are provided up to the striking part 15 for positioning.

On the other hand, in the embodiment shown in FIG. 15, the wirings are provided so that a tip part of the electrical wirings in the optoelectronic circuit board is present at a shorter side (right side in FIG. 15) than the optical path turning mirror face 16. That is, it is the embodiment in which the striking part 15 for positioning, the optical path turning mirror face 16 and a tip part of the electrical wirings described above are formed in this position order. The above embodiment is preferred since the optical wirings and the electrical wirings can be wired so that they do not interrupt each other.

In any of the embodiments shown in FIG. 12 to FIG. 15, the electrical wirings of the connector are arranged so that they fit to a position of the electrical wirings in the optoelectronic circuit board, whereby the electrical wirings of the optoelectronic circuit board can electrically be connected with the electrical wirings of the connector.

Figure 16:
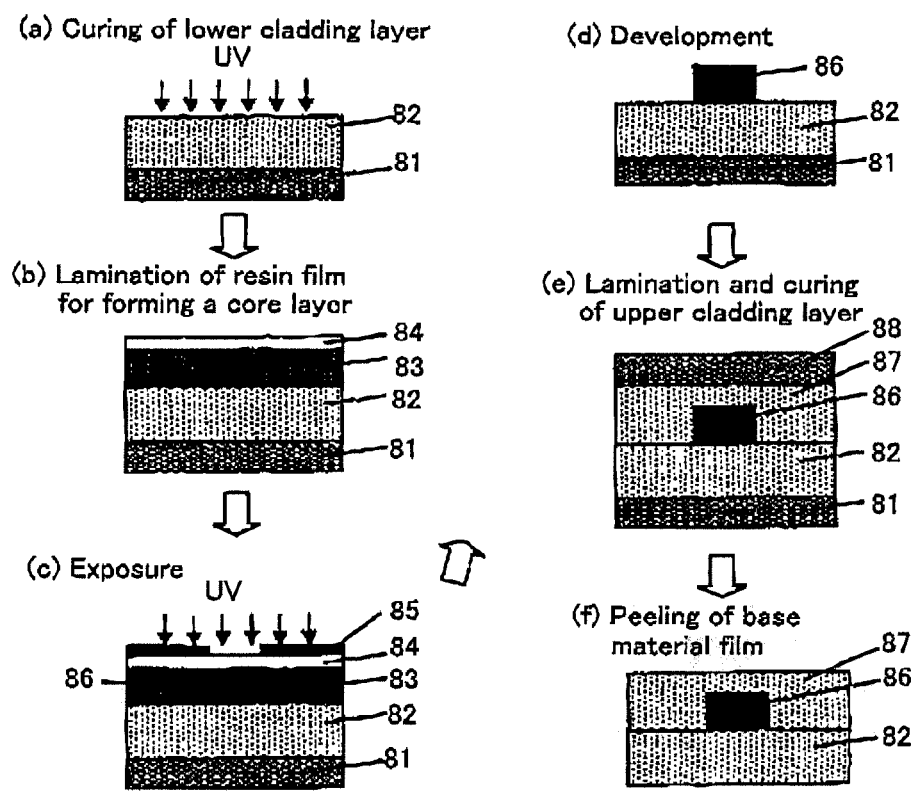
FIG. 16 is a drawing showing a production step of the optical waveguide of the present invention.

Next, the optical waveguide of the present invention shall be explained in detail. The optical waveguide of the present invention has such a structure a cross-sectional drawing of which is shown in FIG. 16 (f).

Base Material:

In the optical waveguide of the present invention, light which is propagated through the core layer 13 is reflected, as shown in FIG. 1 or FIG. 3, on the optical path turning mirror face 16 and changed in an angle, and then it is transmitted through the base material 11 and received in a light-sensitive device (optical, device 20). Also, when the optical device 20 is a light emitting device, light emitted from the light emitting device is transmitted through the base material 11, reflected on the optical path turning mirror face 16 and changed in an angle, and then it is propagated through the core layer 13. Accordingly, it is important that the base material 11 is excellent in a transparency in a wavelength of an optical signal. Further, a film having a high transparency is preferably used for the base material 11 in order to provide the optical waveguide with a flexibility and a toughness.

A material for the film shall not specifically be restricted, and from the viewpoint of having a transparency, a flexibility and a toughness, it includes suitably polyesters such as polyethylene terephthalate, polybutylene terephthalate, polyethylene naphthalate and the like, polyethylene, polypropylene, polyamide, polycarbonate, polyphenylene ether, polyether sulfide, polyallylate, liquid crystal polymers, polysulfone, polyethersulfone, polyetherether ketone, polyetherimide, polyamideimide, polyimide and the like.

A thickness of the film may be changed according to the targeted flexibility and is preferably 5 to 250 μm. If it is 5 μm or more, the advantage that the toughness is liable to be obtained is provided, and if it is 250 μm or less, the satisfactory flexibility is obtained.

A support film used in a production step of the resin film for forming a cladding layer described later can be used as the base material 11. In this case, the resin film for forming a cladding layer is preferably a film obtained by forming a film of the resin for forming a cladding layer on the support film subjected to adhesion treatment. This makes it possible to enhance an adhesive force between the lower cladding layer and the base material and inhibit inferior peeling of the lower cladding layer and the base material. In this connection, the adhesion treatment is treatment in which an adhesive force between the support film and the resin for forming the lower cladding layer formed thereon is enhanced by mat processing such as coating of a readily adhesive resin, corona treatment, sand blast and the like.

Further, when a base material different from the support film described above is used as the base material 11, the resin film for forming a cladding layer in which a film of the resin for forming a cladding layer is formed on the support film may be transferred on the base material 11 by a lamination method. In this case, the above support film is preferably not subjected thereon to adhesion treatment.

Also, as described above, a so-called flexible electric wiring board can be the base material 11 in producing the optoelectronic circuit board. Or, electric wirings can be formed on the base material 11 after producing the optical waveguide. The flexible electric wiring board suitably includes, for example, boards obtained by providing electric wirings on a polyimide film by a copper wire.

Resin for Forming a Cladding Layer and Resin Film for Forming a Cladding Layer:

The resin for forming a cladding layer used in the present invention shall not specifically be restricted as long as it is a resin composition which has a lower refractive index than that of the core layer and which is cured by light or heat, and thermosetting resin compositions and light-sensitive resin compositions can suitably be used. More suitably, the resin for forming a cladding layer is constituted preferably by a resin composition containing (A) a base polymer, (B) a photopolymerizable compound and (C) a photopolymerization initiator. In the resin compositions used for the resin for forming a cladding layer, components contained in the above resin compositions may be the same or different in the upper cladding layer 14 and the lower cladding layer 12, and the refractive indices of the above resin compositions may be the same or different.

The base polymer (A) is used in order to form a cladding layer and secure a strength of the above cladding layer, and it shall not specifically be restricted as long as it is a polymer which can achieve the above purposes. It includes phenoxy resins, epoxy resins, (meth)acryl resins, polycarbonate resins, polyallylate resins, polyetheramide, polyetherimide, polyethersulfone and the like or derivatives thereof. The above base polymers may be used alone or in a mixture of two or more kinds thereof. Among the above base polymers, the polymers having an aromatic skeleton in a principal chain are preferred from the viewpoint of having a high heat resistance, and the phenoxy resins are particularly preferred. Also, the epoxy resins, particularly the epoxy resins which are solid at room temperature are preferred from the viewpoint that they can three-dimensionally be cross-linked to enhance a heat resistance thereof. Further, a compatibility thereof with the photopolymerizable compound (B) described later is important in order to secure a transparency of the resin for forming a cladding layer, and the phenoxy resins and the (meth)acryl resins each described above are preferred from the above viewpoint. In this connection, the (meth)acryl resin means an acryl resin and a methacryl resin.

Among the phenoxy resins, the resins containing bisphenol A, a bisphenol A type epoxy compound or derivatives thereof and bisphenol F, a bisphenol F type epoxy compound or derivatives thereof as constitutional units of copolymerization components are preferred since they are excellent in a heat resistance, an adhesive property and a solubility. The bisphenol A and the bisphenol A type epoxy compound include suitably tetrabromobisphenol A, tetrabromobisphenol A type epoxy compounds and the like. Also, the bisphenol F and the bisphenol F type epoxy compound include suitably tetrabromobisphenol F, tetrabromobisphenol F type epoxy compounds and the like. The specific example of a bisphenol A/bisphenol F copolymer type phenoxy resin includes "Phenotohto YP-70" (trade name) manufactured by Tohto Kasoi Co., Ltd.

The epoxy resin which is solid at room temperature includes, for example, bisphenol A type epoxy resins such as "Epotohto YD-7020, Epotohto YD-7019 and Epotohto YD-7017" (trade names) manufactured by Tohto Kasei Co., Ltd. and "Epikote 1010, Epikote 1009 and Epikote 1008" (trade names) manufactured by Japan Epoxy Resins Co., Ltd.

Next, the photopolymerizable compound (B) shall not specifically be restricted as long as it is polymerized by irradiation with light such as a UV ray and the like, and it includes compounds having an ethylenically unsaturated group in a molecule and compounds having two or more epoxy groups in a molecule.

The compounds having an ethylenically unsaturated group in a molecule include (meth)acrylates, vinylidene halides, vinyl ethers, vinylpyridine, vinylphenol and the like, and among them, the (meth)acrylates are preferred from the viewpoint of a transparency and a heat resistance.

All of monofunctional (meth)acrylates, difunctional (meth)acrylates and trifunctional or higher multifunctional (meth)acrylates can be used as the (meth)acrylates. In this regard, the (meth)acrylate means acrylate and methacrylate.

The compounds having two or more epoxy groups in a molecule include difunctional or multifunctional aromatic glycidyl ethers such as bisphenol A type epoxy resins and the like, difunctional or multifunctional aliphatic glycidyl ethers such as polyethylene glycol type epoxy resins and the like, difunctional alicyclic glycidyl ethers such as hydrogenated bisphenol A type epoxy resins and the like, difunctional aromatic glycidyl esters such as diglycidyl phthalate and the like, difunctional alicyclic glycidyl esters such as diglycidyl tetrahydrophthalate and the like, difunctional or multifunctional aromatic glycidylamines such as N,N-diglycidylaniline and the like, difunctional alicyclic epoxy resins such as alicyclic diepoxy carboxylates and the like, difunctional heterocyclic epoxy resins, multifunctional heterocyclic epoxy resins, difunctional or multifunctional silicon-containing epoxy resins and the like. The above photopolymerizable compounds (B) can be used alone or in combination of two or more kinds thereof.

Next, the photopolymerization initiator of the component (C) shall not specifically be restricted, and the initiator used when the epoxy compound is used for the component (B) includes aryl diazonium salts, diaryl iodonium salts, triaryl sulfonium salts, triaryl selenonium salts, dialkyl phenazyl sulfonium salts, dialkyl-4-hydroxyphenylsulfonium salts, sulfonic acid esters and the like.

Further, the initiator used when the compound having an ethylenically unsaturated group in a molecule is used for the component (B) includes aromatic ketones such as benzophenone and the like, quinones such as 2-ethylanthraquinone and the like, benzoin ether compounds such as benzoin methyl ether and the like, benzoin compounds such as benzoin and the like, benzyl derivatives such as benzyl dimethyl ketal and the like, 2,4,5-triarylimidazole dimers such as 2-(o-chlorophenyl)-4,5-diphenylimidazole dimers and the like, benzimidazoles such as 2-mercaptobenzimidazole and the like, phosphine oxides such as bis(2,4,6-trimethylbenzoyl)phenylphosphine oxide and the like, acridine derivatives such as 9-phenylacridine and the like, N-phenylglycine derivatives, coumarin base compounds and the like. Further, thioxanthone base compounds may be combined with tertiary amine compounds as is the case with combination of diethyl thioxanthone with dimethylaminobenzoic acid. Among the compounds described above, the aromatic ketones and the phosphine oxides are preferred from the viewpoint of enhancing a transparency of the core layer and the cladding layer. The above photopolymerization initiators (C) can be used alone or in combination of two or more kinds thereof.

A blend amount of the base polymer (A) is preferably 5 to 80% by mass based on the whole amount of the component (A) and the component (B). Also, a blend amount of the photopolymerizable compound (B) is preferably 95 to 20% by mass based on the whole amount of the component (A) and the component (B).

In respect to the blend amounts of the component (A) and the component (B), assuming that a blend amount of the component (A) is 5% by mass or more and that a blend amount of the component (B) is 95% by mass or less, the resin composition can readily be turned into a film. On the other hand, assuming that a blend amount of the component (A) is 80% by mass or less and that a blend amount of the component (B) is 20% by mass or more, the component (A) can readily be tangled and cured. A pattern formability is enhanced in producing the optical waveguide, and the optical curing reaction sufficiently advances. The blend amounts of the component (A) and the component (B) are more preferably 10 to 85% by mass of the component (A) and 90 to 15% by mass of the component (B), further preferably 20 to 70% by mass of the component (A) and 80 to 30% by mass of the component (B).

A blend amount of the photopolymerization initiator (C) is preferably 0.1 to 10 parts by mass based on a whole amount 100 parts by mass of the component (A) and the component (B). If the above blend amount is 0.1 part by mass or more, the optical sensitivity is sufficiently high, and on the other hand, if it is 10 parts by mass or less, absorption light is not increased on a surface layer of the light-sensitive rosin composition, so that optical curing in the inside is sufficiently high. Further, in using it for the optical waveguide, the propagation loss is prevented from growing large by influence of light absorption of the photopolymerization initiator itself; and it is suited. From the above viewpoints, a blend amount of the photopolymerization initiator (C) is more preferably 0.2 to 5 parts by mass.

Further, in addition to the above, so-called additives such as an antioxidant, a yellowing inhibitor, a UV ray absorber, a visible light absorber, a colorant, a plasticizer, a stabilizer, a filler and the like may be added, if necessary, to the rosin for forming a cladding layer in such a proportion that adverse influences are not exerted on the effects of the present invention.

The resin film for forming a cladding layer can readily be produced by dissolving the resin composition containing the components (A) to (C) each described above in a solvent, coating the solution on the support film described above and removing the solvent.

The support film used in a production step of the resin film for forming a cladding layer shall not specifically be restricted in a material thereof, and various materials can be used. From the viewpoint of a flexibility and a toughness of the support film, the materials shown as the examples of the film material for the base material 11 are similarly listed.

A thickness of the support film may suitably be changed according to the targeted flexibility, and it is preferably 5 to 250 µm. If it is 5 µm or more, the advantage that the toughness is liable to be obtained is provided, and if it is 250 μm or less, the satisfactory flexibility is obtained.

In the above case, from the viewpoints of protecting the resin film for forming a cladding layer and providing a winding property thereof in producing it in a roll form, a protective film may be adhered, if necessary, on the resin film for forming a cladding layer. The same films as those listed for the examples of the support film can be used as the protective film, and they may be subjected, if necessary, to release treatment and antistatic treatment.

The solvent used in the above case shall not specifically be restricted as long as it can dissolve the above resin composition, and capable of being used are for example, solvents such as acetone, methyl ethyl ketone, methyl cellosolve, ethyl cellosolve, toluene, N,N-dimethylacetamide, propylene glycol monomethyl ether, propylene glycol monomethyl ether acetate, cyclohexanone, N-methyl-2-pyrrolidone and the like or mixed solvents thereof. A solid matter concentration in the resin solution is preferably about 30 to 80% by mass.

The thicknesses of the lower cladding layer 12 and the upper cladding layer 14 (hereinafter abbreviated as the cladding layer 12 and the cladding layer 14) fall preferably in a range of 5 to 500 μm in terms of a thickness after drying. If they are 5 μm or more, the clad thickness required for shutting light up can be secured, and if they are 500 μm or less, the film thickness can readily be controlled. From the above viewpoints, the thicknesses of the cladding layers 12 and 14 fall more preferably in a range of 10 to 100 μm.

On the other hand, in an optical waveguide in which an optical path turning mirror is formed as is the case with the present invention, light passes through a cladding layer at an upper side or a lower side of a core. Accordingly, the cladding layer which is a light path thereof is preferably thinner in order to enhance an optical loss in a part through which light passes and a bond efficiency thereof with an optical device. A thickness of the cladding layer through which light passes is, as described above, preferably 35 μm or less, more preferably 10 to 25 μm, and it is particularly preferably controlled to 10 μm or less by optimizing the material and the film forming method.

The thicknesses of the cladding layer 12 and the cladding layer 14 may be the same or different in the lower cladding layer 12 which is first formed and the upper cladding layer 14 for embedding a core pattern, and a thickness of the cladding layer 14 is preferably larger than that of the core layer 12 in order to embed the core pattern.

Resin Film for Forming a Core Layer:

Next, the resin film for forming a core layer used in the present invention shall be explained in detail.

A resin composition which is designed so that the core layer 13 has a higher refractive index than those of the cladding layer 12 and the cladding layer 14 and which can form a core pattern by an actinic ray can be used as the resin for forming a core layer which constitutes the resin film for forming a core layer, and a light-sensitive resin composition is suitable. To be specific, the same resin composition as used in the resin for forming a cladding layer described above is preferably used. That is, it is the resin composition containing the components (A), (B) and (C) each described above and containing, if necessary, the optional components described above.

The resin film for forming a core layer can readily be produced by dissolving the resin composition containing the components (A) to (C) described above in a solvent, coating the solution on the support film and removing the solvent. The solvent used above shall not specifically be restricted as long as it can dissolve the above resin composition, and the solvents shown as the examples of the solvents used for producing the resin film for forming a cladding layer can be used. Usually, a solid matter concentration in the resin solution is preferably 30 to 80% by mass.

A thickness of the resin film for forming a core layer shall not specifically be restricted, and a thickness of the core layer 13 after drying is controlled usually to 10 to 100 μm. If a thickness of the above layer is 10 μm or more, provided is the advantage that a tolerance of positioning can be expanded in bonding with a light receiving and emitting device or an optical fiber after forming the optical waveguide. If it is 100 μm or less, provided is the advantage that a bond efficiency is enhanced in bonding, with a light receiving and emitting device or an optical fiber after forming the optical waveguide. From the above viewpoints, a thickness of the above film falls more preferably in a range of 30 to 70 μm.

The support film used in a production step of the resin film for forming a core layer is a support film for supporting the resin film for forming a core layer and shall not specifically be restricted in a material thereof, and it includes suitably polyesters such as polyethylene terephthalate and the like, polypropylene, polyethylene and the like from the viewpoints that the resin for forming a core layer is readily peeled off later and that they have a heat resistance and a solvent resistance.

A thickness of the above support film is preferably 5 to 50 μm. If it is 5 μm or more, the advantage that a strength of the support film is liable to be obtained is provided, and if it is 50 μm or less, the advantage that a gap from a mask is reduced in forming patterns to make it possible to form the finer patterns is provided. From the viewpoints described above, a thickness of the above support film falls in a range of more preferably 10 to 40 μm, particularly preferably 15 to 30 μm.

From the viewpoints of protecting the resin film for forming a core layer and providing a winding property thereof in producing it in a roll form, a protective film may be adhered, if necessary, on the resin film for forming a core layer. The same films as those listed for the examples of the support film can be used as the protective film, and they may be subjected, if necessary, to release treatment and antistatic treatment.

Production Process for Optical Waveguide:

A production process for the optical waveguide of the present invention shall be explained in detail (refer to FIG. 16). One example of an embodiment in which the resin film for forming a cladding layer and the resin film for forming a core layer are used shall specifically be explained in a production example shown below.

First, a resin film for forming a cladding layer constituted from a resin for forming a cladding layer and a support film is used in a first step, and the above resin for forming a cladding layer is cured by light or heat to form a lower cladding layer 82 (FIG. 16 (*a*)). In the above case, the support film described above is a base material 81 for the lower cladding layer 82 shown in FIG. 16 (*a*).

The above lower cladding layer 82 has preferably no difference in a level on a surface of a core layer lamination side and is flat from the viewpoint of an adhesive property with a core layer described later. Also, a surface flatness of the cladding layer 82 can be secured by using the resin film for forming a cladding layer.

In a case where a protective film is provided at a side reverse to the support film of the rosin film for forming a cladding layer, the above protective film is peeled off, and then the resin for forming a cladding layer is cured by light or heat to form the cladding layer 82. In the above case, a layer of the resin for forming a cladding layer is preferably formed on the support film subjected to adhesion treatment. On the other hand, the protective film is preferably not subjected to adhesion treatment in order to facilitate peeling thereof from the resin film for forming a cladding layer, and it may be subjected, if necessary, to release treatment.

Next, a core layer 83 is formed on the lower cladding layer 82 by a second step and a third step each described below in detail.

To be specific, a resin film for forming a core layer is heated and pressed onto the lower cladding layer 82 by means of a roll laminator in the second step to laminate the core layer 83 (FIG. 16 (b)). The adhesion property and the followability are enhanced by heating and pressing. The laminate temperature falls preferably in a range of 30 to 100° C. If the temperature is higher than 30° C., an adhesive property between the lower cladding layer and the core layer is enhanced, and if it is 40° C. or higher, the adhesive property can further be enhanced. On the other hand, if it is 100° C. or lower, the core layer does not flow in roll lamination, and the required film thickness is obtained. From the above viewpoints, the laminate temperature falls in a range of more preferably 40 to 70° C., further preferably 50 to 60° C. The pressure is preferably 0.2 to 0.9 MPa. The laminate speed is preferably 0.1 to 3 m/minute, but the above conditions shall not specifically be restricted.

The resin film for forming a core layer is constituted preferably from a resin for forming a core layer and a support film 84 from the viewpoint of a handling property, and in this case, the resin for forming a core layer is laminated on a side of the lower cladding layer 82. Further, the resin film for forming a core layer may be constituted from the resin for forming a core layer alone.

In a case where a protective film is provided at a side reverse to a base material of the resin film for forming a core layer, the above protective film is peeled off, and then the resin for forming a core layer is laminated. In the above case, the protective film and the support film are preferably not subjected to adhesion treatment in order to facilitate peeling thereof from the resin film for forming a core layer, and they may be subjected, if necessary, to release treatment.

Next, the core layer 83 is exposed and developed in the third step to form a core pattern 86 of the optical waveguide (FIG. 16 (c) and (d)). To be specific, an actinic ray is imagewise irradiated through a photomask pattern 85. A light source of the actinic ray includes, for example, publicly known light sources which emit effectively a UV ray such as a carbon arc lamp, a mercury vapor arc lamp, an ultrahigh pressure mercury lamp, a high pressure mercury lamp, a xenon lamp and the like. Further, in addition to the above, lamps which emit effectively a visible light such as a photographic flood bulb, a sun light and the like can be used as well.

Next, when the support film 84 of the resin film for forming a core layer remains, the support film 84 is peeled off, and the unexposed part is removed by wet development and the like to carry out development, whereby the core pattern 86 is formed. In a case of the wet development, development is carried out by publicly known methods such as spray, shaking dipping, brushing, scrapping and the like using an organic solvent base developer which is suited to a composition of the film described above.

The organic solvent base developer includes, for example, N-methylpyrrolidone, N,N-dimethylformamide, N,N-dimethylacetamide, cyclohexanone, methyl ethyl ketone, γ-butyrolactone, methyl cellosolve, ethyl cellosolve, propylene glycol monomethyl ether, propylene glycol monomethyl ether acetate and the like. Further, two or more kinds of developing methods may be used in combination.

The developing method includes, for example, a dipping method, a puddling method, a spraying method such as a high pressure spraying method and the like, brushing, scrapping and the like, and the high pressure spraying method is the most suitable in order to enhance the resolution.

Heating at 60 to 250° C. or exposure at 0.1 to 1000 mJ/cm2 may be carried out, if necessary, as treatment after development to thereby further cure the core pattern 86.

Then, carried out is a fourth step in which the resin film for forming a cladding layer is laminated in order to embed the core pattern 86 and in which the resin for forming a cladding layer in the resin film for forming a cladding layer is cured to form an upper cladding layer 87 (FIG. 16 (e)).

To be specific, the resin film for forming a cladding layer is heated and pressed onto the core pattern 86 under pressure reduction atmosphere by means of a vacuum pressure type laminator in the fourth step (FIG. 16 (e)). In the above case, the resin film is heated and pressed preferably by means of a flat plate type laminator under pressure reduction atmosphere in the fourth step from the viewpoint of enhancing the adhesive property and the followability.

In the present invention, the flat plate type laminator means a laminator in which lamination materials are interposed between a pair of flat plates and bonded by applying pressure on the flat plates. A vacuum pressure type laminator described in, for example, the patent document 2 can suitably be used as the flat plate type laminator. An upper limit of the vacuum degree which is a measure of pressure reduction is preferably 10000 Pa or less, more preferably 1000 Pa or less. The lower vacuum degree is preferred from the viewpoint of the adhesive property and the followability. On the other hand, a lower limit of the vacuum degree is preferably about 10 Pa from the viewpoint of the productivity (time spent for vacuuming). The heating temperature is preferably 40 to 130° C., and the pressing pressure is preferably 0.1 to 1.0 MPa (1 to 10 kgf/cm2). The above conditions shall not specifically be restricted.

When the resin film for forming a cladding layer comprises the resin for forming a cladding layer and the support film, the lamination is carried out with the resin for forming a cladding layer being set to a core pattern 86 side. In the above case, a thickness of the cladding layer 87 is, as described above, preferably larger than that of the core pattern 86. The curing is carried out in the same manner as described above by light or heating.

In a case where a protective film is provided at a side reverse to the support film of the resin film for forming a cladding layer, the above protective film is peeled of and then the resin film for forming a cladding layer is laminated and cured by light or heat to thereby form the cladding layer 87.

The optical waveguide of the present invention is characterized by having an optical path turning mirror face such as a 45 degree optical path turning mirror face and the like. A method for forming the mirror face includes, for example, methods such as cutting polish by dicing and the like and abrasion by laser irradiation.

Industrial Applicability

According to the present invention, capable of being provided are an optical waveguide and an optoelectronic circuit board each having a simple configuration in which an optical device is not mounted on an optical wiring part or an optoelectronic composite wiring part and capable of connecting an optical device with a core of an optical waveguide in an optical wiring part (optical waveguide) or an optoelectronic composite wiring part (optoelectronic circuit board) at a high position accuracy and an optical module comprising an optical waveguide or an optoelectronic circuit board and a connector.

What is claimed is:

1. An optical module comprising an optical waveguide and a connector connected with the above optical waveguide, wherein the above optical waveguide comprises a waveguide structure of a lower cladding layer, a patternized core layer and an upper cladding layer; a striking part for positioning is formed of the waveguide structure and is provided at one end part of the waveguide structure; an optical path turning mirror face is formed of the lower cladding layer, the patternized core layer and the upper cladding layer of the waveguide structure, and is provided in the one end part of the waveguide structure, in a position inside of said striking part; an inner wall part, which is brought into contact with the striking part in connecting the optical waveguide to determine a position of the optical waveguide, is provided in the above connector; and the above connector further comprises a cage member and a fixing member,
  wherein the optical waveguide is provided on the cage member, and the fixing member is positioned overlying the cage member so as to fix the optical waveguide on the cage member by pressing the fixing member on the optical waveguide, when the optical waveguide is positioned on the cage member,
  wherein the optical module further comprimises a base material, the optical waveguide and the striking part being provided on the base material, and wherein the base material includes a tip part which extends beyond the striking part and away from the optical waveguide, and
  wherein the fixing member rotates around a rotation shaft from a first position where the fixing member does not press on the optical waveguide, to a second position where the fixing member presses on the optical waveguide, when the optical waveguide is positioned on the cage member: and wherein the fixing member is positioned such that when the fixing member rotates from said first position to said second position, said fixing member presses the tip part downward while pulling the tip part by the rotation.

2. The optical module according to claim 1, wherein the connector has a space part for mounting an optical device, and the optical device is mounted in the above space part; and positioning of the optical device and the optical path turning mirror face is carried out by striking the striking part to the inner wall part of the connector.

3. The optical module according to claim 2, wherein the optical device is a surface emitting laser or a photodiode.

4. The optical module according to claim 2, wherein the space part is embedded with a resin having a transparency in a wavelength band of an optical signal.

5. The optical module according to claim 1, wherein the connector has a guide mechanism.

6. The optical module according to claim 1, wherein an optoelectronic circuit board in which the optical waveguide is integrated with electric wirings is connected with the connector.

7. The optical module according to claim 6, wherein the optoelectronic circuit board is connected with an optical waveguide having a flexibility and an electric wiring board having a flexibility.

8. The optical module according to claim 6, wherein a tip part of the electrical wiring is present closer to a striking part side of the optical waveguide than the optical path turning mirror face, and the above electrical wiring is wired so that it does not interfere with an optical path.

9. The optical module according to claim 6, wherein the striking part, the optical path turning mirror face and a tip part of the electrical wiring are formed in this position order.

10. The optical module according to claim 1, further comprising a base material, and wherein the waveguide structure and the striking part are positioned on the base material.

11. The optical module according to claim 1, wherein the striking part is formed of material of the upper and lower cladding layers and the patternized core layer of the waveguide structure, that extends beyond the optical path turning mirror face.

12. The optical module according to claim 11, further comprising a base material, and wherein the waveguide structure and the striking part are positioned on the base material.

13. The optical module according to claim 1, wherein said optical path turning mirror face is provided separate from and inside of said striking part.

14. The optical module according to claim 1, wherein a side end part of the optical waveguide is provided with a guide mechanism.

15. The optical module according to claim 1, wherein the striking part for positioning is spaced apart from the optical path turning mirror face.

16. The optical module according to claim 1, wherein the optical path turning mirror face is spaced from the striking part by a removed portion of the waveguide structure that has been removed in forming the optical path turning mirror face.

17. The optical module according to claim 16, wherein said removed portion of the waveguide structure has been removed by cutting, polishing or abrasion.

18. The optical module according to claim 1, wherein the fixing member is movable from a first position where it is not in contact with the optical waveguide when the optical waveguide is provided on the cage member, to a second position in contact with the optical waveguide when the optical waveguide is provided on the cage member, so as to fix the optical waveguide on the cage member.

19. The optical module according to claim 18, wherein the fixing member rotates around a pivot point from said first position to said second position.

20. The optical module according to claim 1, wherein the fixing member presses on an upper surface of the striking part in fixing the optical waveguide on the cage member.

21. The optical module according to claim 1, wherein the fixing member presses on an upper surface of the striking part and on an upper surface of the optical waveguide in fixing the optical waveguide on the cage member.

22. The optical module according to claim 1, wherein the connector has a guide, and the tip part of the base material interfits with said guide.

23. The optical module according to claim 1, wherein the striking part has a height which is the same as a height of the waveguide structure, and has a width and length.

* * * * *